United States Patent [19]

Hurst, Jr. et al.

[11] Patent Number: 5,012,444

[45] Date of Patent: Apr. 30, 1991

[54] OPPOSED FIELD MAGNETORESISTIVE MEMORY SENSING

[75] Inventors: Allan T. Hurst, Jr., Anoka, Minn.; Arthur V. Pohm, Ames, Iowa

[73] Assignee: Honeywell Inc., Minneapolis, Minn.

[21] Appl. No.: 504,777

[22] Filed: Apr. 4, 1990

[51] Int. Cl.$^5$ .............................................. G11C 11/15
[52] U.S. Cl. ...................................... 365/173; 365/158
[58] Field of Search ................................. 365/158, 173

[56] References Cited

U.S. PATENT DOCUMENTS

| | | | |
|---|---|---|---|
| 4,731,757 | 3/1988 | Daughton et al. | 365/173 |
| 4,780,848 | 10/1988 | Daughton et al. | 365/173 |
| 4,829,476 | 5/1990 | DuPuis et al. | 365/158 |
| 4,918,655 | 4/1990 | Daughton | 365/173 |

Primary Examiner—Joseph A. Popek
Attorney, Agent, or Firm—Gregory A. Bruns; Theodore F. Neils

[57] ABSTRACT

A method for sensing magnetic states of magnetic bit structures formed of separated double layer, magnetoresistive, ferromagnetic memory films through providing a word line current in a direction which results in a magnetic field due thereto, in the memory films of these bit structures, that is oriented in a direction opposite a common direction followed at least partially by orientations of edge magnetizations in these films that are parallel to the edges thereof, and sensing a change in electrical resistance of these bit structures as a result of that current.

36 Claims, 5 Drawing Sheets

OPPOSED FIELD MAGNETORESISTIVE MEMORY SENSING

BACKGROUND OF THE INVENTION

The present invention relates to ferromagnetic thin-film memories and, more particularly, to ferromagnetic thin-film memories in which states of the memory cells based on magnetization direction are determined through magnetoresistive properties of the thin-film sensed by an electronic circuit.

Digital memories of various kinds are used extensively in computers and computer system components, digital processing systems, and the like. Such memories can be formed, to considerable advantage, based on the storage of digital system bits as alternative states of magnetization in magnetic materials in each memory cell, typically ferromagnetic thin-film materials. The information stored in such films is stored therein through selected directions of magnetization occurring in that film, this information being obtainable from such films through either inductive sensing to determine the magnetization state, or by magnetoresistive sensing of such states. Ferromagnetic thin-film memories of this nature may be conveniently provided on the surface of a monolithic integrated circuit chip to provide easy electrical interconnections between the memory cells and the memory operating circuitry provided in the chip.

Ferromagnetic thin-film memory cells can be made very small and they can be packed very closely together to achieve a significant density of stored information bits, properties which are the basis of permitting them to be provided on the surface of a monolithic integrated circuit, as indicated above. Suitable constructions for such cells can be found in U.S. Pat. No. 4,731,757 to Daughton et al entitled "Magnetoresistive Memory Including Thin Film Storage Cells having Tapered Ends" and U.S. Pat. No. 4,780,848 to Daughton et al entitled "Magnetic Memory" and an earlier filed application by J. M. Daughton having Ser. No. 07/161,534 entitled "Magnetic Device Integrated Circuit Interconnection System," all of which have been assigned to the same assignee as the present application and are herein incorporated by reference. A structure analogous in some respects to those disclosed there is shown, as an example, in FIG. 1.

There, a bit structure, 10, from a series string of them in a monolithic integrated circuit is presented in a portion of that integrated circuit such that the opposite ends thereof, 11, are exposed. Bit structure 10 is shown formed over a semiconduotor material body, 12, in and on which the monolithic integrated circuit is formed. Bit structure 10 is provided directly on an insulating layer, 13, supported on a major surface of body 12 in the integrated circuit chip. As indicated above, just a portion of the integrated circuit is shown, and then only a small part of the semiconductor body for that portion of the integrated circuit is shown in the figure.

Semiconductor material body 12 is typically formed of a doped silicon material of primarily either p- or n-type conductivity, with other regions of opposite conductivity provided therein to form circuit elements or portions of circuit elements. Insulating layer 13 is typically formed of silicon nitride both as an electrical insulator and as an oxygen barrier to prevent any oxygen from migrating therefrom into bit structure 10 and oxidizing any of the magnetic materials therein.

Bit structures like bit structure 10 are usually provided, as previously indicated, in a memory as a series string of such bit structures extending both ways from ends 11 where exposed at the edges of the integrated circuit portion shown in FIG. 1. The bit structures in series are connected to each other in such an arrangement at junctures, 14, provided at each end of each of the bit structures where they provide an electrical short circuit for interconnecting them, and at the ends of each series string for interconnecting it to other circuit components in the monolithic integrated circuit operating the memory.

The remainder of bit structure 10 disposed on the exposed major surface of insulating layer 13 is comprised of a lower ferromagnetic thin-film, 15, and an upper ferromagnetic thin-film, 16. Ferromagnetic thin-film layers 15 and 16 exhibit uniaxial anisotropy, magnetoresistance, little magnetostriction, and are of an alloy composition typically comprising nickel, cobalt and iron. Typically, proportions of each are chosen to strongly reduce or eliminate any magnetostrictive effects in the films, and to improve certain other properties of them for the application.

Between ferromagnetic thin-film layers 15 and 16 is a further thin layer, 17, which usually would not be one exhibiting ferromagnetism, but may be either an electrical conductor or an electrical insulator. Layer 17 must, however, in this construction, prevent the exchange interaction between electron spins on neighboring atoms from coupling across the separation between layers 15 and 16 to thereby lock together the magnetizations of each. A typical choice for layer 17 would be tantalum doped with nitrogen.

A further diffusion barrier and protective layer, 18, is provided over upper ferromagnetic thin-film 16. This layer again can be formed of nitrogen doped tantalum. In junctures 14 there are further provided two other conductive layers, the first layer, 19, being formed of copper doped aluminum on which is provided a second layer, 20, of tungsten. These layers provide an electrical short between adjacent bit structures as indicated above.

An insulating layer, 21, is then provided to electrically isolate bit structure 10 from further structures to be provided thereabove. Layer 21 is typically formed of silicon nitride. A word line conductor, 22, is then provided over layer 21 extending to the tapered portions at the ends of bit structure 10. Both layers 21 and 22 are only partially shown in FIG. 1, with other portions thereof having been removed from the right-hand portion of bit structure 10 in that figure so that bit structure 10 can be more clearly seen. Word line conductor 22 is typically formed with a thin layer of titanium and tungsten followed by a layer of copper doped aluminum. A passivation layer, 23, of silicon nitride is then provided over the entire structure, though this layer is also only partly shown, to protect it from external contaminants.

Bit structure 10 can be operated in a longitudinal mode having its easy axis extend between junctures 14 perpendicular to the direction of extension of word line conductor 22, or in a transverse mode having its easy axis of magnetization parallel with the direction of extension of word line conductor 22. In either situation, information, kept as a binary bit having one of two alternative logic values in bit structure 10, is stored therein in layers 15 and 16 by having the magnetization oriented to point in one direction or the other (but opposite in each of these layers to the direction in the other), generally along the easy axis of magnetization. If the direction of magnetization is caused to rotate from such a direction by external magnetic fields, the electrical resistance of layers 15 and 16 change with this magnetization direction rotation because of the magnetoresistive properties of such layers.

Near the edges of films 15 and 16, assuming that the easy axis is parallel with word line 22, anisotropy fields are dominated by the demagnetization fields due to the "free poles" at these edges. If the magnetizations of films 15 and 16 were saturated, the demagnetization fields would approach half the saturation fields, or perhaps 5,000 Oersteds, for these films with the alloys described here. Typical films of these alloys will have a coercivity and an anisotropy field on the order of only 20 Oersteds, leading to instabilities in the magnetization at the edges of these films.

In such large demagnetization fields, electron spins at the edges of the films are constrained to lie nearly parallel to these edges and the direction of elongation of these films. The directions of these electron spins only gradually turn to pointing across the films further inward toward the center of the films with the demagnetizing fields no longer overcoming the isotropy field. The rate, shape and distance of the currents are all a complex function depending on the magnetostatics of the situation, the quantum exchange interaction between adjacent atom electron spins, and the anisotropy considerations not unlike those leading to Néel walls.

Thus, the magnetization along the transverse axis is at or very nearly at zero at the outer edges of the films where word line 22 crosses them, and gradually increases in inward locations which are closer to the interior of the films, the magnetization value increasing toward the saturation value occurring in the central portions of the films. In the regions between the portions adjacent to the exterior edges of the film and the point where magnetic saturation begins, the film magnetizations are in transition from pointing along the direction of elongation to pointing along the direction of the easy axis. Therefore, such ferromagnetic thin-films having their easy axes extending in directions transverse to the direction of elongation thereof, or parallel to word line 22, do not truly saturate across the films along the easy axis but only across a part of such a film.

A representation of the magnetizations of a section of one of films 15 and 16 from between its tapered parts is shown in FIGS. 2A and 2B. FIG. 2A shows the magnetizations for the storage of a "0" logic value bit of information with the magnetizations at central locations shown pointed upward in that figure and edge magnetizations therein shown pointed primarily to the right. FIG. 2B shows the magnetizations for the storage of a "1" logic value bit of information with the magnetizations at central locations shown pointed downward in that figure, and with edge magnetizations therein shown still pointed primarily to the right.

Sense current refers to the current flow through bit structure 10 from one juncture 14 to the other juncture 14 thereof, and word current refers to current flowing in word line 22 adjacent to, and extending in a direction traverse to the direction of elongation of, bit structure 10. Bit structure 10 can be placed in one of two possible magnetization states along an easy axis thereof as shown in FIGS. 2A and 2B through the selective application of sense and word currents, i.e. information can be stored or "written" into bit structure 10.

Bit structure 10, in the configuration shown in FIG. 1 or in other typical configurations, in the past was typically placed in a "0" logic value magnetization state on the basis of providing a word current of typically 10.0 mA to 30.0 mA flowing in a direction which creates a magnetic field in films 15 and 16 oriented in the same common direction as the edge magnetizations of those films were primarily. A current through word line 22 giving such a result in a magnetic field will be termed a positive word line current or positive word current. Previous to this current flow, the edge magnetizations of films 15 and 16 were set by the application of a strong external magnetic field of typically a few thousand Gauss. The setting of a "0" logic value magnetization state was then completed by providing a sense current of typically 2.0 mA to 3.5 mA coincidentally with the provision of the word current.

The opposite magnetization state representing a "1" logic value magnetization state was alternatively set into bit structure 10 through providing the same word current in the same direction, i.e. a positive word current, but providing a sense current of the same magnitude in the opposite direction through bit structure 10. Such magnetization state changes will occur very quickly after the proper current levels are reached, such changes between such states occurring in less than about 10 ns.

Determining which magnetization state occurs in bit structure 10, i.e. retrieving or "reading" the information stored in bit structure 10, is done by providing externally caused magnetic fields in that bit structure through providing coincidental sense and word currents to rotate the magnetization of that structure. As indicated above, differences occur in the electrical resistance encountered between junctures 14 in bit structure 10 for the magnetization being in different directions in the structure, including changing from one easy axis direction magnetization state to the opposite direction state. These differences in electrical resistance of bit structure 10, due to its magnetoresistive properties, result if differences in direction occur between the orientation substantially of magnetization in the thin-films and the direction of current being passed therethrough. The maximum resistance occurs when substantially the magnetization direction in the film and the current direction are parallel, while the minimum resistance occurs when they are perpendicular to one another.

The electrical resistance of the magnetoresistive resistors, or films 15 and 16, forming bit structure 10 can be shown to be a constant value representing the minimum electrical resistance encountered plus an additional value depending on the angle between the direction of current in the thin-films and the magnetization primarily occurring therein. This additional resistance has a value which follows the square of the cosine of that angle. As a result, there will be differences in the voltage developed across bit structure 10 between junctures 14 by a constant value sense current flowing therethrough depending on the predominant magnetization direction in this structure, and so depending on which magnetization state initially is present therein.

In an information retrieval operation of the kind that has been used in the past with a bit structure such as bit structure 10, a current through word line 22 is again applied which results in a magnetic field in layers 15 and 16. The current flow direction is chosen such that this resulting field is directed parallel with the common direction predominantly followed by the edge magnetizations of those layers as previously set by an external magnetic field as described above, that is, a positive word current. This word current for this method of information retrieval can be a current of a value comparable to that used in storing information, as described above, if destruction of the information content of bit structure 10 is an acceptable result of such a retrieval. Otherwise, the word current must be of a significantly smaller magnitude if such a destruction of information is to be avoided.

However, the choice of such a smaller current will lead to a smaller resistance difference between "0" and "1" logic value magnetization states and so a smaller output signal. A word current in the writing range of from 10.0 mA to 30.0 mA will lead to either a continued "0" state, or to an initial "1" state becoming thereafter, as a result of such an information retrieval, a "0" state. On the other hand, the advantage to providing larger word current and risking such a destruction of information is that this will result in the maximum resistance difference between the magnetization states and so the largest output signal. Typically, this output signal is provided through the passing of a sense current through bit structure 10 between junctures 14 in the same direction as it was provided for the establishment of a "0" magnetization state in the bit structure.

An example of the retrieval situation for this method is given in FIG. 3 based on the "0" and "1" logic value magnetization states electrical resistance characteristics of bit structure 10 shown there. Bit structure 10 in the "0" magnetization state exhibits the lower curve in FIG. 3 as its electrical resistance versus applied word current characteristic, and is shown there for a sense current of 3.5 mA. This lower curve, or "0" magnetization state resistance characteristic, can be seen to have a generally positive slope. The upper curve is the electrical resistance characteristic of bit structure 10 with the same sense current but which has, instead, a "1" magnetization state written therein.

In this latter situation of a stored "1" magnetization state, bit structure 10 exhibits a higher electrical resistance versus word line current than it does in the "0" state, at least for lower word line current values up to a break point. This situation is shown in the higher valued and more positively sloped resistance characteristic represented in the upper curve of FIG. 3. For word currents sufficient to pass the break point, the "1" magnetization state is switched, or "rewritten," to a "0" magnetization state just as in the storing, or "writing," of selected magnetization states in bit structure 10 described above. This causes the resistance characteristic to revert to essentially that of the lower curve in FIG. 3.

Thus, if the word current is chosen to be sufficient to change a "1" logic value magnetization state to a "0" magnetization state, the information retrieval process will be a destructive one leading to the loss of the information stored in bit structure 10 (whenever a "1" state is in storage at the start of the process). Such an information loss would have to be replaced in a subsequent refresh writing operation if information integrity in the memory array using such bit structures was to be maintained.

On the other hand, as was seen in FIG. 3, the maximum resistance change occurs at the break point giving the peak resistance change in response to a word current, and so the peak voltage change across bit structure 10 between junctures 14 for a given sense current flowing therethrough. This is the maximum signal available for indicating the presence of a "1" logic value magnetization state as opposed to a "0" magnetization state, and is typically 1.0 to 2.0 mV in this information retrieval method for a 3.5 mA sense current. The application of word currents less than the break point word current value in FIG. 3 will still provide a voltage change across bit structure 10 in response to a sense current therethrough, but of a magnitude less than the peak signal available. Such a nondestructive information retrieval, of course, eliminates the need for a later refresh operation.

The arrows shown along the two resistance characteristics in FIG. 3 are those showing the resistance change locus which will occur in providing a word line current pulse going from 10.0 mA to 30.0 mA and back to 10.0 mA. The short arrows along the lower current characteristic give the electrical resistance change locus for there being a "0" magnetization state in bit structure 10 at the time of such a word current excursion. The long arrows along the upper characteristic, and along the lower characteristic where they merge, gives the results for the occurrence of a "1" magnetization state in that structure during the same word current excursion. The dashed arrows along the upper characteristic show the resistance path taken for an alternative word current excursion with a "1" magnetization state in bit structure 10, a word current excursion in which the magnitude thereof is limited to reaching a value less than the break point shown there.

The change in the electrical resistance values in FIG. 3 are shown to be in tenths of Ohms in a design for bit structure 10 having around 100 $\Omega$ or so of total electrical resistance between its junctures 14. A 0.3 $\Omega$ change with a sense current of 3.5 mA flowing through bit structure 10 means that the voltage change peak is only on the order of 1.0 mV in a nominal voltage value across that structure of 0.3 V.

Such changes in the voltage drop across bit structure 10, or equivalently, in the electrical resistance of that bit structure, mean a very small output signal must be detected on top of a relatively very large nominal value, and typically in the presence of an electrically noisy background. Such conditions can be overcome to some extent by sensing the output signal from bit structure 10 in a differential arrangement with a reference voltage. This arrangement, in effect, more or less subtracts out that large underlying voltage leaving the increment due to the presence of a word line current being applied to bit structure 10.

However, differences between various bit structures in which information is stored in a memory lead to the underlying voltage occurring across a bit structure 10 due to the sense current therethrough to differ from one bit structure to another. Therefore, choosing a reference value for use in the differential sensing system, to be subtracted from the voltage across bit structure 10 in which the information to be retrieved is stored, would be difficult if a single constant value is to be chosen. In addition, conditions such as temperature, differing positions of bit structures in the array, and others will also vary from one bit structure to another leading to further differences in the underlying voltage occurring across each. These differences can be compensated for to a significant extent by the use of other, similar bit structures as resistor references in a reference arrangement which results in them having the same sense current flow therethrough but which are not subjected to a word line current flowing thereover.

Further steps can be taken to enhance the detection of the signal in a bit structure 10 by limiting sources of errors such as offsets in the electronics between an information content bit structure and the reference bit structure it is being differentially sensed against. This can be done through use of "autozero" techniques in which capacitors are used to couple a bit structure 10 and an associated reference bit structure to a differential sensing amplifier. These capacitors are initially charged to the different voltages across the bit structure arrangements connected to each amplifier input to thereby eliminate offsets from being applied to that amplifier during a subsequent information retrieval operation. Further, the amplifier can be bandwidth limited to reduce the amount of electrical noise transmitted therethrough. These techniques are more fully described in U.S. Pat. No. 4,829,476 to DuPuis et al which is assigned to the same assignee as the present application and incorporated herein by reference.

Despite such measures, none of them alone or in combination with others are sufficient to eliminate errors in detection of the output signals of bit structures like bit structure 10 in all circumstances. Thus, there is a strong desire to provide an increased output signal to reduce such detection errors.

SUMMARY OF THE INVENTION

The present invention provides a method for sensing magnetic states of magnetic bit structures of the kind described above through providing a word line current in a direction which results in a magnetic field due thereto, in the memory films of these bit structures, that is oriented in a direction opposite a common direction followed at least partially by orientations of edge magnetizations in these films that are parallel to the edges thereof, and sensing a change in electrical resistance of these bit structures as a result of that current. Such a word line current provides an electrical resistance characteristic extending from that previously used, this extended portion offering greater resistance changes for a given word line current than that portion used in the former method and, if used with the formation of a magnetic wall in the memory films, offers even higher output resistance change. This method can also be used with a reference voltage source for differential sensing, and can use "autozeroing" techniques through having the bit structures capacitively coupled to a sensing amplifier with provisions for charging the coupling capacitances prior to an information retrieval operation.

DETAILED DESCRIPTION OF THE PREFERRED EMBODIMENTS

Figure 1:
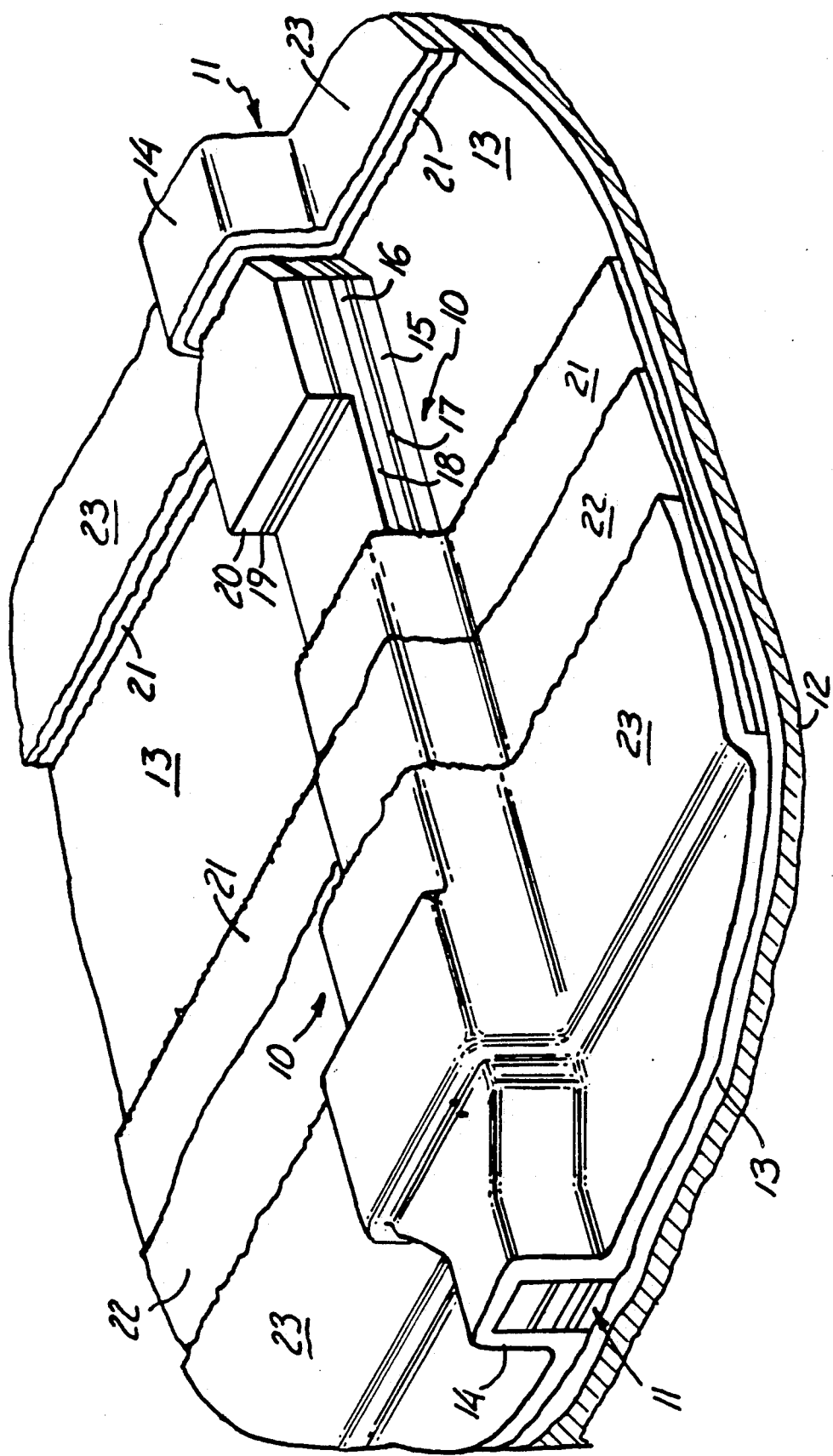
FIG. 1 shows a pictorial view of a portion of a structure with respect to which the present invention is practiced, FIGS. 2A and 2B each show a diagrammatical representation of a state of a section of the structure shown in FIG. 1.
Figure 3:
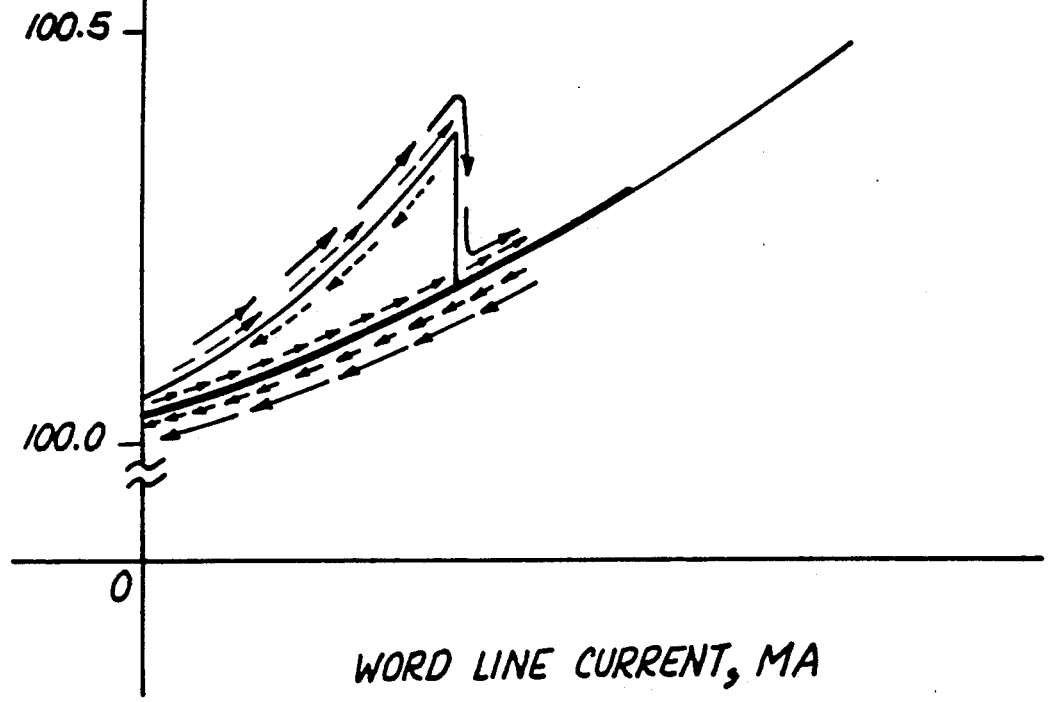
FIG. 3 shows a resistance characteristic of the structure of FIG. 1.
Figure 4:
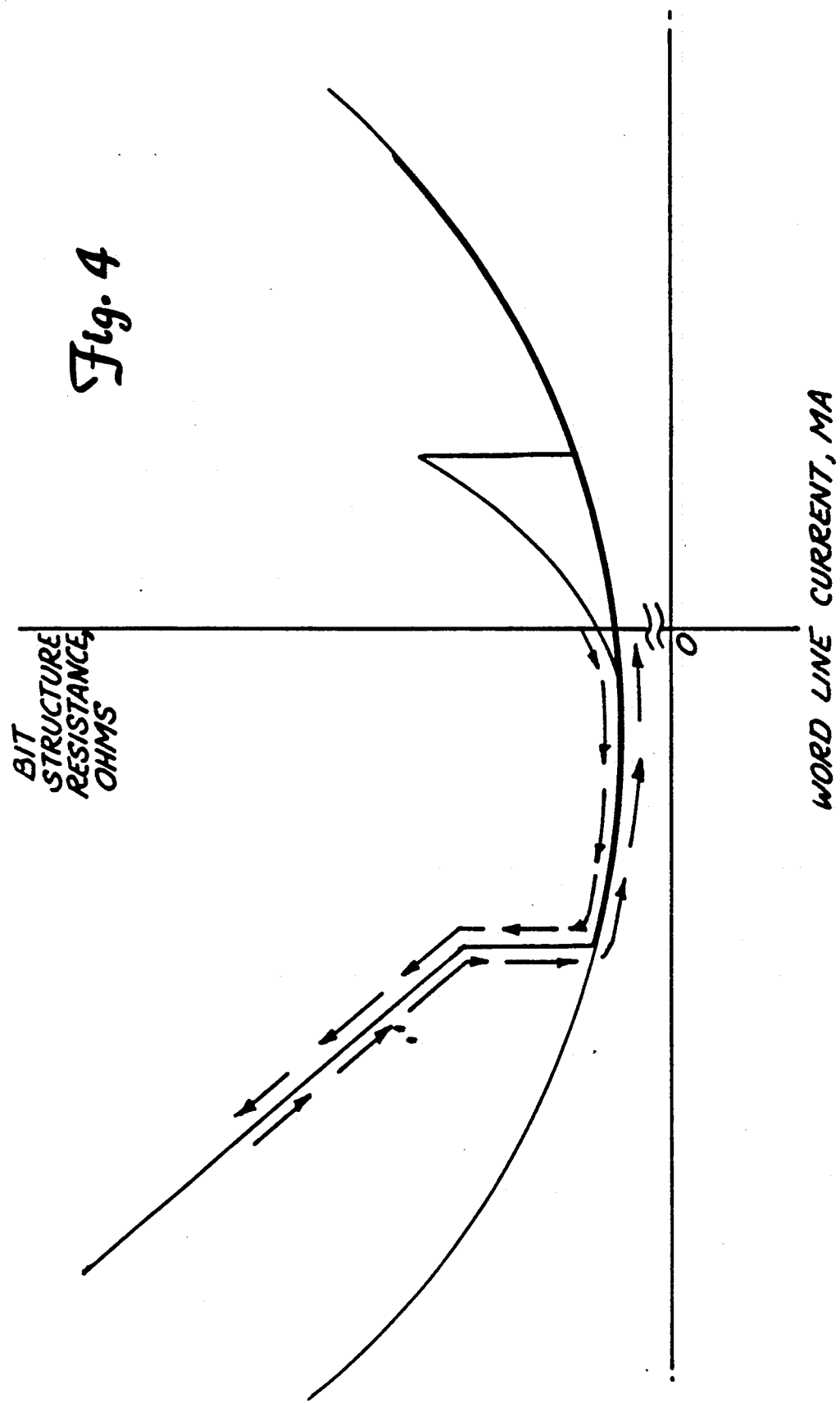
FIG. 4 shows a resistance characteristic of the structure of FIG. 1, FIGS. 5A and 5B each show a diagrammatical representation of a state of a section of the structure shown in FIG. 1.

FIG. 4 shows the electrical resistance versus word line current characteristics of bit structure 10 of FIG. 1 for both "0" and "1" logic value magnetization states occurring therein, the lower characteristic representing the "0" state. However, the characteristics shown in FIG. 4 are not only for positive word line currents as are shown in FIG. 3, but for negative word line currents as well. Here, negative word line currents mean currents flowing through word line 22 in a direction which results in a magnetic field due thereto in the memory films of bit structure 10 that is oriented in a direction opposite a common direction followed at least partially by orientations of edge magnetizations in those films that are parallel to the edges thereof.

Discovery that different electrical resistance versus word line current characteristics result from use of negative word line currents over bit structure 10, rather than positive word currents, has also shown that significantly greater output signals can be obtained in sensing the presence of one of the magnetization states that can be stored in bit structure 10 than was heretofore recognized. This output improvement comes about because of the discoveries (a) that values of negative word line current over bit structure 10 can be chosen to provide a smaller resistance minimum for the whole of bit structure 10 in either magnetization state beyond that which is encountered at a zero or positive word line current value, and (b) that a magnetic wall forms at greater values of negative word line current leading to sharply higher resistance in bit structure 10 for one of the magnetization states therein.

Returning to FIGS. 2A and 2B, representations were shown there of the magnetization at various locations in one of layers 15 and 16 of bit structure 10 of FIG. 1 in the absence of any word line current or sense current. FIG. 2A was arbitrarily chosen to show a "0" logic value magnetization state and FIG. 2B was alternatively chosen to show a "1" logic value magnetization state. A positive word line current creates a magnetic field due to the word line in the film shown in FIGS. 2A and 2B which points to the flowing to the right will create a field that tends to cause the magnetizations to point upward in those figures. The resultant of the sense current field in the word line current field in each figure acts to rotate the magnetizations of the film toward the upper right in each of those figures.

Figure 2B:
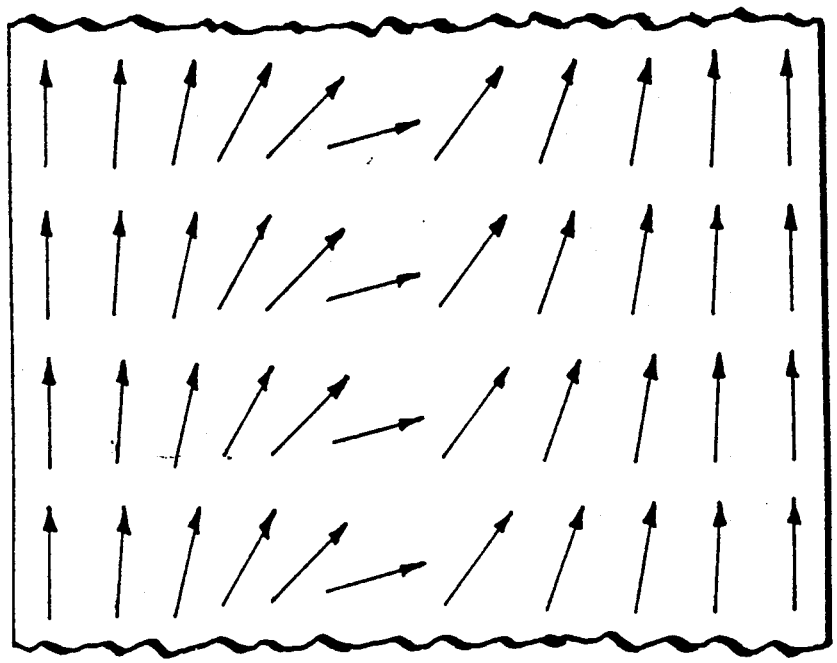
Figure 2A:
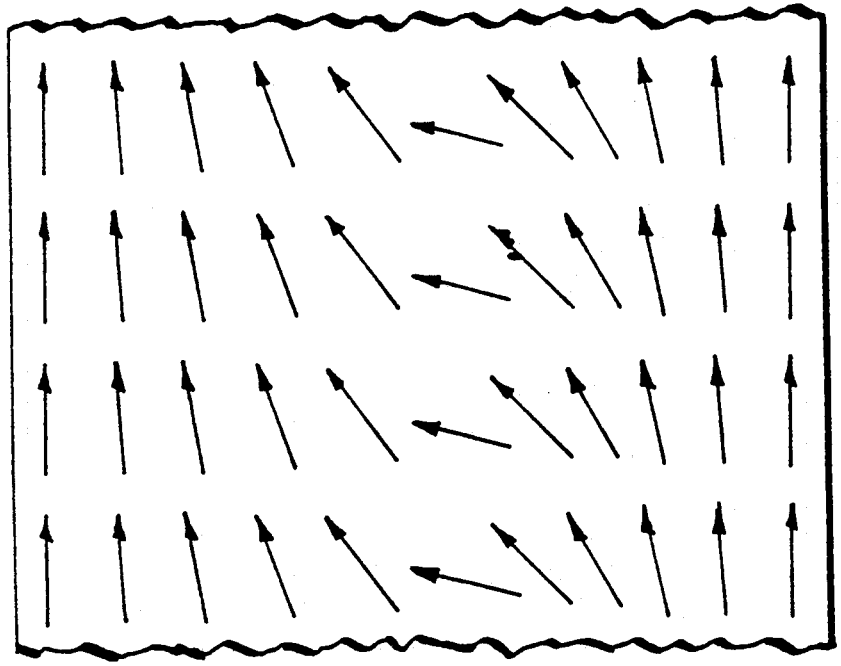

Thus, a sufficient word line current will cause the magnetizations pointing downward in FIG. 2B to rotate toward the upper right portion of those figures, and will result in leaving those magnetizations pointing upward, i.e. switching magnetization states. This rotation will also cause the peak resistance (at the moment the magnetization is most parallel with the direction of the sense current) to occur during the switching process. A lesser word line current will, in the presence of a sense line current, rotate the downward pointing magnetization vectors in FIG. 2B toward the right thus increasing the electrical resistance of the film portion shown to sense current flowing therethrough. The result is a characteristic such as that shown in FIG. 3.

However, as can be seen in FIGS. 2A and 2B, the magnetizations of the material in the central parts of the film portions shown in FIGS. 2A and 2B do not lie precisely along the vertical direction, either vertically upward in FIG. 2A or vertically downward in FIG. 2B. Rather, each of them is rotated slightly toward the right from the vertical positions in those figures. This is a result of the influence of the edge magnetizations shown at the tops and bottoms of the film portions of each of FIGS. 2A and 2B which are directed toward the right in being parallel to the upper and lower edges of the film shown. The application of a lower edges of the film shown. The application of a significant negative word line current for sense current flow in either direction will result in a field in the film portions which tends to rotate the magnetizations of the central parts of the film portions toward the left, thus making them more perpendicular to the path of the rightward flowing sense current. As a result, the resistance of these film portions decreases for the application of some negative word current leading to the minimum therefor shown in FIG. 4 to the left of the zero word current axis.

A further increase in magnitude of negative word line current leads to further rotation of the magnetization of the central parts of these films to the left, and so past the point where they are perpendicular to the rightward flow of sense current. Hence, the resistance of the film begins to increase again for either magnetization state as the magnitude of the negative word current is further increased. Again, that is what is shown in the characteristics of FIG. 4.

Still greater increases in the magnitude of negative word current lead to a divergence in results for the lower curve representing a "0" magnetization state and the upper curve representing the results for a "1" magnetization state. In the situation of the lower characteristic curve of FIG. 4, greater magnitudes of negative word current lead to some further rotating of the magnetization vectors in the central parts toward being more anti-parallel with the direction of current flow to thereby cause a greater electrical resistance due to the magnetoresistive effect. In addition, the greater word line currents cause heating of the film, and, because of the film having a positive temperature coefficient, the resistance thereof also increases. This can be seen in the upward sloping to the left in the lower or "0" magnetization state resistance characteristic of FIG. 4.

Figure 5B:
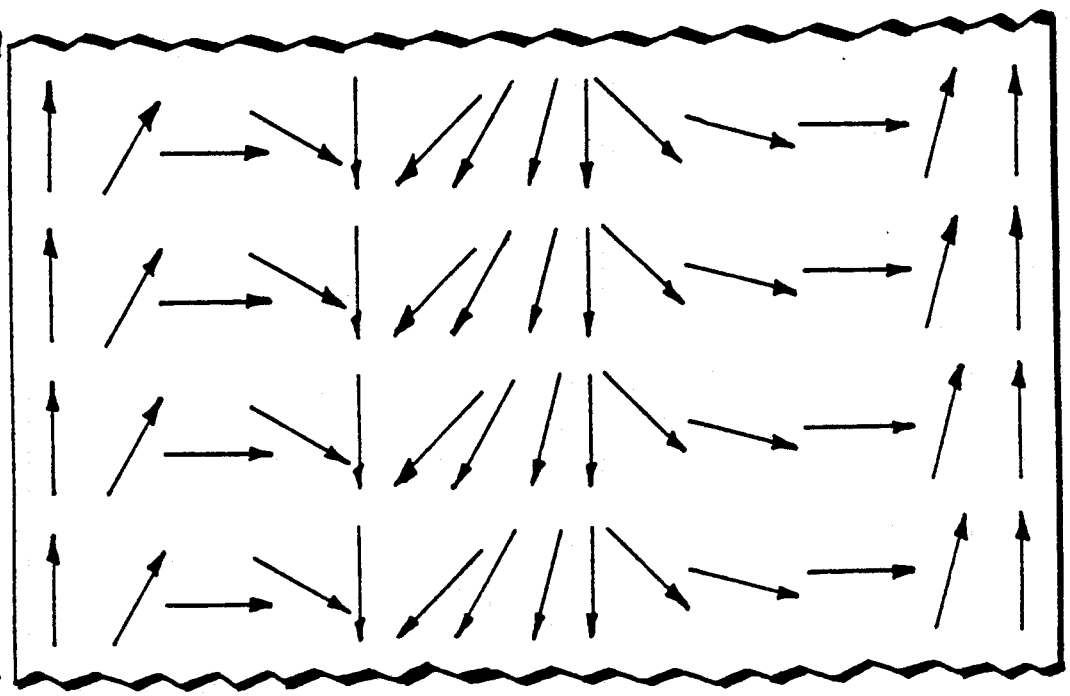
Figure 5A:
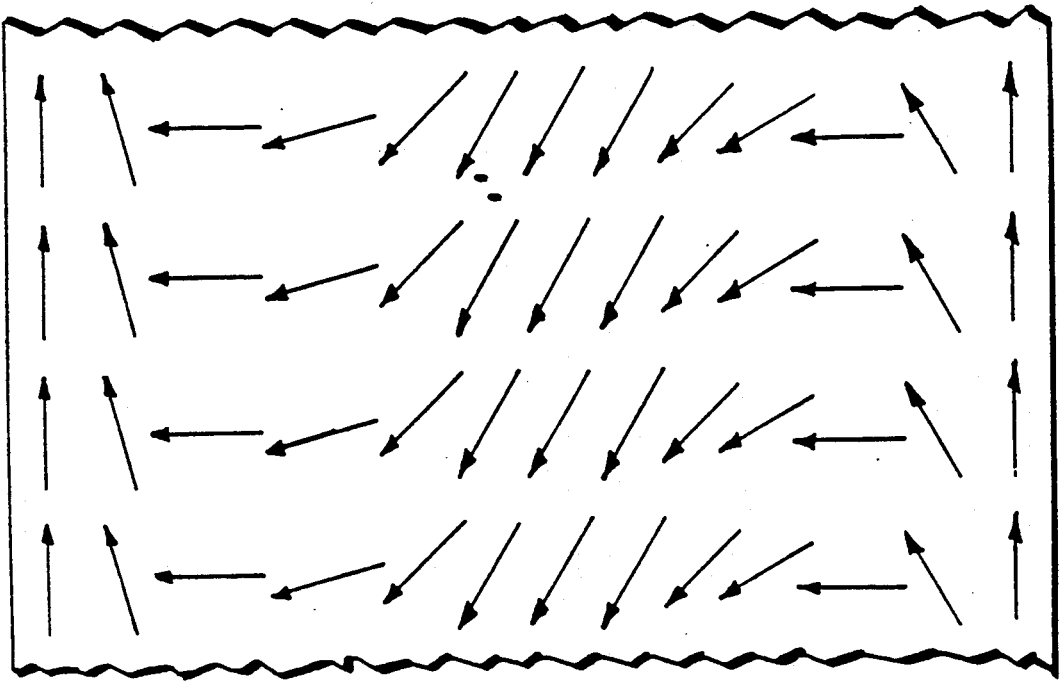

This is also reflected in the diagram of FIG. 5A where the magnetization vectors are represented at several points in a section of the material of one of films 15 and 16 with a substantial negative word current being applied, and with the application of a sense current flowing from left to right. As can be seen there, the magnetization vectors of FIG. 5A have been forced toward the upper left-hand location of the piece of film material shown from what they were in FIG. 2A, but with the edge magnetizations being substantially maintained due to the demagnetizing effects requiring such a result as described above.

These edge magnetizations have a continuing effect on the magnetization of the interior parts of the film portions shown, as can be seen in FIG. 5A where only the magnetization in the central parts is shown rotating to follow the resultant magnetic field. The magnetization vectors located closest to the edges of the film essentially maintain the orientation they had in FIGS. 2A and 2B with there being a gradual transition from that orientation to the orientation in the central parts of the film in FIG. 5A which follows the direction of the resultant magnetic field coming about from the application of the word line and sense currents.

A much different situation occurs for greater magnitudes of negative word current for the upper curve or the "1" magnetization state resistance characteristic of FIG. 4. The application of a greater magnitude of negative word current leads to a sudden jump in the resistance value of bit structure 10 as is clearly shown in FIG. 4. FIG. 5B shows a representation of the magnetizations of a section of one of films 15 and 16 with this section being chosen near word line 22. As can be seen there, the initial "1" magnetization state leads to a considerably greater fraction of the magnetization vectors pointing in a direction opposite that which the edge magnetization vectors point than is the situation in FIG. 5A.

This situation certainly causes an increase in electrical resistance of bit structure 10 due to the magnetoresistive effect, but also leads to the formation of a magnetic wall between central portions of bit structure 10 and the edge portions of bit structure 10 all the way down into the taper portion near junctures 14 of that structure. That is, a Néel wall forms at a sufficient value of negative word current, that value of such current sufficient to initiate the wall being dependent on several material magnetic parameters and structure parameters such as roughness. The formation of the magnetic wall leads to a very sharp increase in electrical resistance therethrough which is reflected in the sharp shift in upper resistance characteristic in FIG. 4 for a particular negative word current value.

Further increases in the magnitude of negative word line current lead to further resistance increases, increases due to some degree to the magnetic wall being forced further into the taper portion of bit structure 10, but thought primarily due again to heating of the film material with its positive temperature coefficient. Again, the positive coefficient of the permalloy material leads to an increase in resistance therein for the added heating thereof due to the increasing magnitude of negative word current. In any event, the magnetic wall is maintained even though forced down into the taper part of bit structure 10 because of the demagnetizing effects occurring at the edges of the film in that structure. These effects result in the magnetizations originally set in the structure films being maintained at least in regions very close to such edges.

The magnetic wall thus formed can be termed a "270° wall" as some of the magnetization vectors are provided at that angle with respect to the direction of magnetization on the other side of that wall. That direction of magnetization is the same as seen at the edges of the film in bit structure 10, as the wall separates the central portions from the edge regions all the way into the tapered ends of that structure.

The alternative of using the "1" logic value magnetization state resistance characteristic with a negative word current instead of a positive word current provides an opportunity of obtaining a significantly greater output signal for a resistance measurement indicating such a magnetization state. The magnitudes of negative word currents can be substantially increased to significantly increase the resulting resistance change, as shown by the locus of resistance changes depicted by the arrows in FIG. 4. Such a word current increase can be made without concern over destroying information through any switching to the alternative magnetization state such as occurs for a relatively low positive word line current as can be seen in FIG. 4. The characteristic in FIG. 4 for negative word line current continues to rise without any sort of a breakover feature for substantial increases in negative word line current because the edge magnetizations of films 15 and 16 in bit structure 10 are strongly maintained by demagnetization effects despite greater negative currents being supplied through word line 22. These edge magnetizations will restore the original bit upon cessation of the word line current which lead to the collapse of the magnetic wall earlier established by the presence of that current.

Thus, a word line current starting from a value of zero can be increased substantially in a negative direction to provide a relatively large voltage output signal across bit structure 10 without destroying the information contained therein in a "1" magnetization state compared to the magnitude of a positive word line current which must be limited if the information is not to be destroyed. Even if destroying the information is acceptable for positive word line current, FIG. 4 clearly shows that a substantially larger resistance change is provided by a negative word line current compared to the maximum which can be provided by a positive word line current.

Of course, the resistance change, and so the output voltage change across a bit structure 10, can be increased for either (a) an application of negative word line current only for purposes of sensing a magnetization state, or (b) an application of an initial negative word line current followed by a positive word line current, by beginning an output signal measurement with respect to bit structure 10 when the word line current thereover has an initial value such that the bit structure film is at its resistance minimum for both the "0" and "1" magnetization state resistance characteristics. There is clearly more resistance change available for the "1" magnetization state resistance characteristic of FIG. 4 when starting at the minimum therein, rather than at zero word current, and applying word current to go either to (a) the left, requiring applications of greater magnitude negative word line currents (even if not sufficient to form a magnetic wall), or alternatively going to (b) the right, eventually requiring application of a positive word line current. This follows since there is a greater resistance change between the minimum point and any other resistance value on the characteristic than there is between that same resistance value and the resistance value of the characteristic at the zero word line current value. Thus, a slight modification to the prior art method of retrieving information stored in a bit structure 10 can provide an improvement in output signals obtained from a "1" magnetization state resistance characteristic even without forming a magnetic wall.

Such increases in resistance changes as last described, to be obtained without having the negative word line current reach a magnitude sufficient to go past the point of formation of a magnetic wall, can be assured in bit structure 10 by merely making it sufficiently narrow. Bit structure 10 can be made so narrow that the edge magnetizations on either edge thereof come sufficiently close together so as to prevent the formation of a magnetic wall. Nevertheless, as described in the preceding paragraph, the use of a negative word line current in that situation can yield greater output signals than the previous method of retrieving information from bit structure 10 using only positive word currents.

Figure 6:
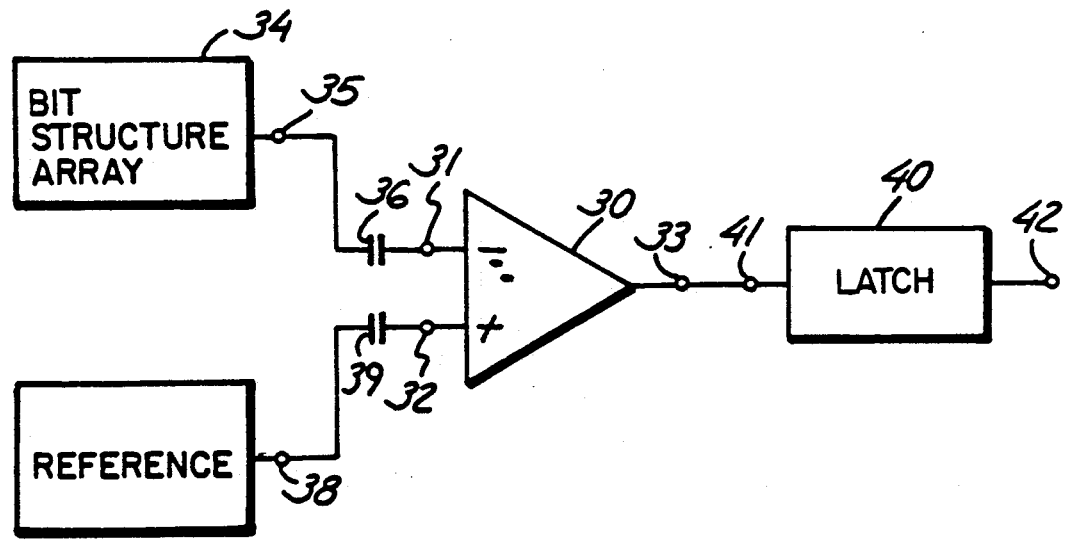
FIG. 6 shows a block and circuit schematic system diagram for practicing the present invention.

FIG. 6 shows a mixed block and circuit schematic diagram of those portions of a magnetoresistive memory system used in connection with "reading" operations for retrieving information stored in the memory bit structure array. A differential sensing amplifier, 30, is shown having an inverting input, 31, a non-inverting input, 32, and an output, 33. An information array, 34, comprising bit structures 10 and associated switching circuitry has been connected at its information output, 35, through a capacitor, 36, arbitrarily to inverting input 31 of sensing amplifier 30. Similarly, a reference arrangement, 37, of one or more bit structures 10 and associated switching circuitry is connected at its output, 38, through a capacitor, 39, to non-inverting input 32 of sensing amplifier 30. Array 34 and arrangement 37 could be interchanged in the connections of the outputs thereof to the inputs of sensing amplifier 30. A data information bit latching means, 40, is connected at its output, 41, to output 33 of sensing amplifier 30. Latching arrangement 40 provides a data information bit at its output, 42, at the end of each reading operation.

In a reading operation, an address of a bit structure containing information desired to be retrieved in array 34 is supplied to that array and a corresponding address of a desired reference structure in arrangement 37 is supplied to that arrangement (although this is perhaps not needed for arrangement 37 in those designs where there is only one bit structure or a few bit structures to be used as a reference bit structure). The address(es) is (are) decoded to provide the proper switching action in the array, and possibly in the arrangement, with respect to the bit structure which is to have the information therein retrieved (and to the one which is to provide a reference if addressing thereof is required). Such action will be based on switching arrangements to provide both sense and word currents at the proper times, and with the amplitudes and in the order required. A further switching operation will be provided to connect the information bit structure output voltage to output 35 of array 34 and the reference bit structure output voltage to output 38 of arrangement 37. An example of the contents of array 34, and possibly arrangement 37, is given in U.S. Pat. No. 4,829,476 referenced above.

These voltages switched to array output 35 and arrangement output 38 will then be coupled through capacitors 36 and 39, respectively, to inputs 31 and 32, respectively, of differential sensing amplifier 30. Differential sensing amplifier 30 will, in effect, subtract the one voltage from the other, amplify the difference, and provide the result at output 33 thereof. If the result at output 33 of amplifier 30, representing either a "0" or "1" information bit, is a voltage which exceeds a threshold of latch arrangement 40, as it will be for one of these states, latch arrangement 40 will provide the appropriate logic value at its output 42. If the other information state is represented by a voltage at output 33 of amplifier 30, that voltage will not exceed the switching threshold of latching arrangement 40, and the appropriate logic value will again be provided at output 42 of latching arrangement 40.

The presence of capacitors 36 and 39 avoids having uncompensated offsets between array 34 and arrangement 37 which would otherwise be presented at the inputs of amplifier 30, whether starting with a zero value word current over the bit structure chosen from array 34 or with an initial biasing word current. These offsets can be relatively large because of the inability to identically match information bit structures in a series string in array 34 with reference bit structures in a series string in arrangement 37. The use of capacitors 36 and 39 in conjunction with switching circuitry in, and with an amplification portion of, amplifier 30 permits these capacitors to be charged to a voltage to oppose the offsets (and any occurring in the amplifier inputs). Such an arrangement gives a much better sensitivity for the very small signals provided by a selected information bit structure. Further, as indicated, capacitors 36 and 39 can be appropriately charged to counter any different offsets which may appear if a biasing negative word line current is used so that the resistance change sensing begins from the minimum point of the "1" and the "0" magnetization state resistance characteristics. An amplifying system suitable for differential sensing amplifier 30 to provide such "autozeroing" capabilities is disclosed in U.S. Pat. No. 4,829,476 referenced above.

Although the present invention has been described with reference to preferred embodiments, workers skilled in the art will recognize that changes may be made in form and detail without departing from the spirit and scope of the invention.

What is claimed is:

1. A method for sensing magnetic states of magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said memory film of each magnetic bit structure having portions thereof sufficiently near either of its said pair of opposite edges exhibiting magnetizations therein oriented substantially parallel to said edges with such edge magnetizations directed at least partially in substantially a common direction, said method comprising:

providing a selected activation current through a first said word line conductor in a direction which results in that magnetic field due thereto in said memory film of a corresponding first said magnetic bit structure being oriented substantially opposite said common direction; and sensing a change in electrical resistance due to said activation current between said first magnetic bit structure first and second terminal portions to provide a signal representative thereof.

2. The method of claim 1 wherein said method further comprises providing a selected sense current through said first magnetic bit structure memory film between said first and second terminal portions thereof which is at least partially concurrent with said providing of said activation current.

3. The method of claim 2 wherein said sense current is maintained substantially constant during at least part of said concurrency, and said sensing of said change in said electrical resistance is accomplished through a sensing amplifier effectively sensing a change in voltage between said first magnetic bit structure first and second terminal portions.

4. The method of claim 3 wherein said sense current passes through a plurality of magnetic bit structures electrically connected in series with one another including said first magnetic bit structure each having a different word line conductor corresponding thereto.

5. The method of claim 3 wherein said first word line conductor corresponds to each of a plurality of magnetic bit structures including said first magnetic bit structure so that said activation current causes a magnetic field in said memory film of each oriented substantially opposite to said common direction thereof.

6. The method of claim 1 wherein a first capacitor means connects one of said first and second terminal portions of said first magnetic bit structure to an input of a sensing amplifier, and said method further comprises charging said first capacitor means prior to said sensing to a selected voltage depending on a value of a calibrating current passing through said word line conductor.

7. The method of claim 6 wherein said sensing amplifier is a differential amplifier having first and second inputs with said first capacitor means being electrically connected to said first input thereof, said sensing amplifier second input being electrically connected by a second capacitor means to one of those first and second terminal portions of a reference resistance means through which a reference current is passing, and wherein said method further comprises charging said first capacitor means prior to said sensing to a selected voltage depending not only on a value of a calibrating current passing through said word line conductor, but also on a first sensing current passing through said first magnetic bit structure memory film, and charging said second capacitor means prior to said sensing to a selected voltage depending on said reference current passing through said reference resistance means.

8. The method of claim 7 wherein said reference resistance is formed by a second magnetic bit structure, and said reference current is a second sense current.

9. The method of claim 1 wherein said activation current is provided reaching a value such that a relatively large shift occurs in said change in said electrical resistance with relatively little further activation current for one of said magnetic states occurring immediately theretofore in said first magnetic bit structure.

10. The method of claim 9 wherein said method further comprises providing a selected sense current through said first magnetic bit structure memory film between said first and second terminal portions thereof which is at least partially concurrent with said providing of said activation current.

11. The method of claim 10 wherein said sense current is maintained substantially constant during at least part of said concurrency, and said sensing of said change in said electrical resistance is accomplished through a sensing amplifier effectively sensing a change in voltage between said first magnetic bit structure first and second terminal portions.

12. A method for sensing magnetic states of magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said method comprising:

providing a magnetic field adequate to cause magnetizations of portions of said memory film sufficiently near either of said pair of opposite edges thereof, forming edge magnetizations, to be oriented parallel to said edges so as to be directed at least partially in substantially a common direction;

providing a selected activation current through a first said word line conductor in a direction which results in that magnetic field due thereto in said memory film of a corresponding first said magnetic bit structure being oriented substantially opposite said common direction; and sensing a change in electrical resistance due to said activation current between said first magnetic bit structure first and second terminal portions to provide a signal representative thereof.

13. The method of claim 12 wherein said method further comprises providing a selected sense current through said first magnetic bit structure memory film between said first and second terminal portions thereof which is at least partially concurrent with said providing of said activation current.

14. The method of claim 13 wherein said sense current is maintained substantially constant during at least part of said concurrency, and said sensing of said change in said electrical resistance is accomplished through a sensing amplifier effectively sensing a change in voltage between said first magnetic bit structure first and second terminal portions.

15. The method of claim 14 wherein said sense current passes through a plurality of magnetic bit structures electrically connected in series with one another, including said first magnetic bit structure each, having a different word line conductor corresponding thereto.

16. The method of claim 14 wherein said first word line conductor corresponds to each of a plurality of magnetic bit structures including said first magnetic bit structure so that said activation current causes a magnetic field in said memory film of each oriented substantially opposite to said common direction thereof.

17. The method of claim 12 wherein a first capacitor means connects one of said first and second terminal portions of said first magnetic bit structure to an input of a sensing amplifier, and said method further comprises charging said first capacitor means prior to said sensing to a selected voltage depending on a value of a calibrating current passing through said word line conductor.

18. The method of claim 17 wherein said sensing amplifier is a differential amplifier having first and second inputs with said first capacitor means being electrically connected to said first input thereof, said sensing amplifier second input being electrically connected by a second capacitor means to one of those first and second terminal portions of a reference resistance means through which a reference current is passing, and wherein said method further comprises charging said first capacitor means prior to said sensing to a selected voltage depending, not only on a value of a calibrating current passing through said word line conductor, but also on a first sensing current passing through said first magnetic bit structure memory film, and charging said second capacitor means prior to said sensing to a selected voltage depending on said reference current passing through said reference resistance means.

19. The method of claim 17 wherein said reference resistance is formed by a second magnetic bit structure, and said reference current is a second sense current.

20. The method of claim 12 wherein said activation current is provided reaching a value such that a relatively large shift occurs in said change in said electrical resistance with relatively little further activation current for one of said magnetic states occurring immediately theretofore in said first magnetic bit structure.

21. The method of claim 20 wherein said method further comprises providing a selected sense current through said first magnetic bit structure memory film between said first and second terminal portions thereof which is at least partially concurrent with said providing of said activation current.

22. The method of claim 21 wherein said sense current is maintained substantially constant during at least part of said concurrency, and said sensing of said change in said electrical resistance is accomplished through a sensing amplifier effectively sensing a change in voltage between said first magnetic bit structure first and second terminal portions.

23. A method for sensing magnetic states of magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said memory film of each magnetic bit structure having portions thereof sufficiently near either of its said pair of opposite edges exhibiting magnetizations therein oriented substantially parallel to said edges with such edge magnetizations directed at least partially in substantially a common direction, said method comprising:

providing a selected activation current through a first said word line conductor in a direction which results in that magnetic field due thereto in said memory film of a corresponding first said magnetic bit structure being oriented substantially opposite said common direction and sufficient to cause a magnetic wall to form between said edge magnetizations and at least a portion of that said memory film interior thereto; and sensing a change in electrical resistance due to said activation current between said first magnetic bit structure first and second terminal portions to provide a signal representative thereof.

24. The method of claim 23 wherein said method further comprises providing a selected sense current through said first magnetic bit structure memory film, between said first and second terminal portions thereof, which is at least partially concurrent with said providing of said activation current. on a value of a calibrating current passing through said word line conductor.

25. The method of claim 24 wherein said sense current is maintained substantially constant during at least part of said concurrency, and said sensing of said change in said electrical resistance is accomplished through a sensing amplifier effectively sensing a change in voltage between said first magnetic bit structure first and second terminal portions.

26. The method of claim 25 wherein said sense current passes through a plurality of magnetic bit structures electrically connected in series with one another, including said first magnetic bit structure, each having a different word line conductor corresponding thereto.

27. The method of claim 25 wherein said first word line conductor corresponds to each of a plurality of magnetic bit structures, including said first magnetic bit structure, so that said activation current causes a magnetic field in said memory film of each oriented substantially opposite to said common direction thereof.

28. The method of claim 23 wherein a first capacitor means connects one of said first and second terminal portions of said first magnetic bit structure to an input of a sensing amplifier, and said method further comprises charging said first capacitor means prior to said sensing to a selected voltage depending on a value of a calibrating current passing through said word line conductor.

29. The method of claim 28 wherein said sensing amplifier is a differential amplifier having first and second inputs with said first capacitor means being electrically connected to said first input thereof, said sensing amplifier second input being electrically connected by a second capacitor means to one of those first and second terminal portions of a reference resistance means through which a reference current is passing, and wherein said method further comprises charging said first capacitor means prior to said sensing to a selected voltage depending, not only on a value of a calibrating current passing through said word line conductor, but also on a first sensing current passing through said first magnetic bit structure memory film, and charging said second capacitor means prior to said sensing to a selected voltage depending on said reference current passing through said reference resistance means.

30. The method of claim 29 wherein said reference resistance is formed by a second magnetic bit structure, and said reference current is a second sense current.

31. A method for sensing magnetic states of magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having portions thereof sufficiently near either of its said pair of opposite edges exhibiting magnetizations therein oriented substantially parallel to said edges with such edge magnetizations directed at least partially in substantially a common direction, said method comprising:

providing a selected activation current through a first said word line conductor in a direction which results in that magnetic field due thereto in said memory film of a corresponding first said magnetic bit structure being oriented substantially opposite said common direction; and sensing a change in electrical resistance due to said activation current between said first magnetic bit structure first and second terminal portions to provide a signal representative thereof.

32. The method of claim 31 wherein said memory film of each said magnetic bit structure has an easy axis of magnetization with directions of magnetization along said easy axis determining said magnetic states of that said magnetic bit structure.

33. The method of claim 32 wherein said easy axis of magnetization of each said magnetic bit structure is oriented substantially along that direction in which its corresponding said word line conductor extends.

34. The method of claim 31 wherein said method further comprises providing a selected sense current through said first magnetic bit structure memory film between said first and second terminal portions thereof which is at least partially concurrent with said providing of said activation current.

35. The method of claim 31 wherein a first capacitor means connects one of said first and second terminal portions of said first magnetic bit structure to an input of a sensing amplifier, and said method further comprises charging said first capacitor means prior to said sensing to a selected voltage depending on a value of a calibrating current passing through said word line conductor.

36. The method of claim 31 wherein said activation current is provided reaching a value such that a relatively large shift occurs in said change in said electrical resistance with relatively little further activation current for one of said magnetic states occurring immediately theretofore in said first magnetic bit structure.

* * * * *

UNITED STATES PATENT AND TRADEMARK OFFICE
CERTIFICATE OF CORRECTION

PATENT NO. : 5,012,444
DATED : April 30, 1991
INVENTOR(S) : Allan T. Hurst, Jr.; Arthur V. Pohm It is certified that error appears in the above-identified patent and that said Letters Patent is hereby corrected as shown below:

Claim 24, Column 16, Lines 62 and 63, delete "on a value of a calibrating current passing through said word line conductor".

Signed and Sealed this

Twenty-seventh Day of October, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 5,012,444

DATED : April 30, 1991

INVENTOR(S) : Allan T. Hurst, Jr.; Arthur V. Pohm

It is certified that error appears in the above-identified patent and that said Letters Patent is hereby corrected as shown below:

Col. 1, line 4, before the first paragraph, insert --The Government has rights in this invention pursuant to Contract No. 87F345500 with the Office of Research and Development.

Signed and Sealed this

First Day of December, 1992

*Attest:*

DOUGLAS B. COMER

*Attesting Officer*    *Acting Commissioner of Patents and Trademarks*